(12) United States Patent
Chien et al.

(10) Patent No.: US 9,543,352 B2
(45) Date of Patent: Jan. 10, 2017

(54) CMOS IMAGE SENSOR WITH EMBEDDED MICRO-LENSES

(71) Applicant: TAIWAN SEMICONDUCTOR MANUFACTURING CO., LTD., Hsinchu (TW)

(72) Inventors: Volume Chien, Tainan (TW); Zen-Fong Huang, Tainan (TW); Chia-Yu Wei, Tainan (TW); Chi-Cherng Jeng, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 14/105,063

(22) Filed: Dec. 12, 2013

(65) Prior Publication Data
US 2015/0171136 A1   Jun. 18, 2015

(51) Int. Cl.
*H01L 27/146* (2006.01)

(52) U.S. Cl.
CPC ..... *H01L 27/14685* (2013.01); *H01L 27/1464* (2013.01); *H01L 27/14621* (2013.01); *H01L 27/14627* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 8,530,266 B1 * | 9/2013 | Chen et al. | 438/73 |
| 2004/0211884 A1 * | 10/2004 | Fang et al. | 250/214.1 |
| 2006/0011932 A1 * | 1/2006 | Kim | H01L 27/14627 257/98 |
| 2009/0200591 A1 * | 8/2009 | Park | 257/292 |

\* cited by examiner

*Primary Examiner* — Angel Roman
*Assistant Examiner* — Kevin Quinto
(74) *Attorney, Agent, or Firm* — McDermott Will & Emery LLP

(57) ABSTRACT

A backside illuminated CMOS image sensor and a manufacturing method thereof are provided. Embedded micro-lenses disposed respectively on concave surfaces of a buffer oxide layer, wherein the concave surfaces are positioned to respectively align with photodiodes of pixel array of the CMOS image sensor. The embedded micro-lenses can confine incident light to the photodiodes to reduce optical crosstalk between adjacent pixels.

17 Claims, 5 Drawing Sheets

CMOS IMAGE SENSOR WITH EMBEDDED MICRO-LENSES

BACKGROUND

Description of Related Art

The cost of CMOS image sensor digital camera systems is being reduced through the use of smaller pixel sizes. Ideally, the reduction in size of CMOS image sensor pixels can be achieved with an improvement in image resolution and without a significant decrease in signal to noise ratio. As image sensor pixel sizes continue to decrease, there is a risk of a reduction in optical efficiency, as well as an increase in optical crosstalk between adjacent image sensor pixels.

One solution to the optical crosstalk between adjacent image sensor pixels is to dispose micro-lenses on the color filter layer of the CMOS image sensor. A typical micro-lens may be a single element with one plane surface and one spherical convex surface to refract the incident light, and micro-lenses is generally with a diameter less than 1 mm and often as small as 10 μm. Each of the spherical convex surfaces has to align with the photodiodes under the color filter layer for gathering incident light into the photodiodes. However, since the micro-lenses above the color filter layer and the layers under the color filter layer are formed in different modules or even manufactured by different manufacturers, alignment errors may occur, and the problem of the alignment error will be more serious as the pixel size is decreased.

DETAILED DESCRIPTION

Figure 1:
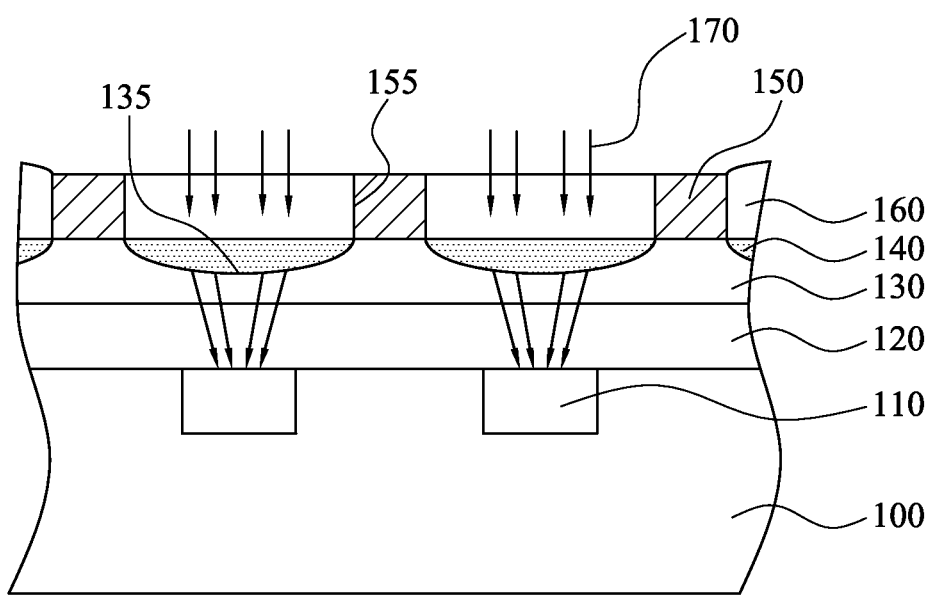
FIG. 1 is a cross-sectional diagram of a backside illuminated CMOS image sensor having embedded micro-lenses according to some embodiments of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Accordingly, in this disclosure, micro-lenses were designed to be embedded respectively under color filter sheets to gather incident light to irradiate on each photodiode in the pixel array of a CMOS image sensor to solve the problem of alignment error between the micro-lenses and the photodiodes in the pixel array.

FIG. 1 is a cross-sectional diagram of a backside illuminated CMOS image sensor having embedded micro-lenses according to some embodiments of this disclosure. In FIG. 1, a substrate 100 has a pixel array formed on a front surface of the substrate 100. The pixel array includes a plurality of photodiodes 110 in the substrate 100. A dielectric layer 120 and a buffer oxide layer 130 are sequentially disposed on the back surface of the substrate 100 and thus cover the backside of the pixel array.

The buffer oxide layer 130 has a plurality of concave surfaces 135 positioned respectively align with each photodiode 110 in the pixel array. Pluralities of micro-lenses 140 are respectively disposed on the concave surfaces 135. Accordingly, these micro-lenses 140 have a convex-like or hemispherical cross section to confine incident light 170 to irradiate on the photodiodes 110 and thus can replace the conventional micro-lens layer.

Next, a grid layer 150 is disposed on the buffer oxide layer 130 and has a plurality of openings 155 exposing the micro-lenses 140 respectively. Color filter sheets 160 are respectively disposed in the openings 155 of the grid layer 150.

According to some embodiments, the dielectric layer 120 can be made from a dielectric material having a dielectric constant greater than or equal to silicon oxide to protect the photodiodes 110. For example, the dielectric layer can be a silicon oxide layer, a silicon nitride layer, or a high-k dielectric material.

According to some other embodiments, the micro-lenses 140 can be made from a transparent material having a refractive index greater than the refractive index of the color filter sheets 160 and smaller than the refractive index of the buffer oxide layer 130. For examples, the transparent material can be made by glass, or a transparent polymer.

According to some other embodiments, the grid layer 150 can be made of silicon oxide or metal. For example, the metal can be Al, Cu, Cr, or an alloy of Cu and Al.

According to yet some other embodiments, for avoiding total internal reflection of the incident light 170, the refractive indexes of the color filter layer 160, the micro-lenses 140, the buffer oxide layer 130, the dielectric layer 120, and the substrate 100 have better to be arranged in an order of from small to large. That is, the refractive index of the color filter layer 160 is better to be smaller than the refractive index of the micro-lenses 140. The refractive index of the micro-lenses 140 is better to be smaller than the refractive index of the buffer oxide layer 130. The refractive index of the buffer oxide layer 130 is better to be smaller than the refractive index of the dielectric layer 120. The refractive index of the dielectric layer 120 is better to be smaller than the refractive index of the substrate 100.

According to some other embodiments, for optimizing the light gathering effect, the focus length of the micro-lenses 140 is better to be equal to the distance from the micro-lenses 140 to the photodiodes 110. Therefore, the incident light 170 can be focused on the photodiodes 110. The factors affecting the focus length include the refraction index of each layer between the micro-lenses 140 and the photodiodes 110, and the radius of curvature of the micro-lenses 140.

Figure 2A:
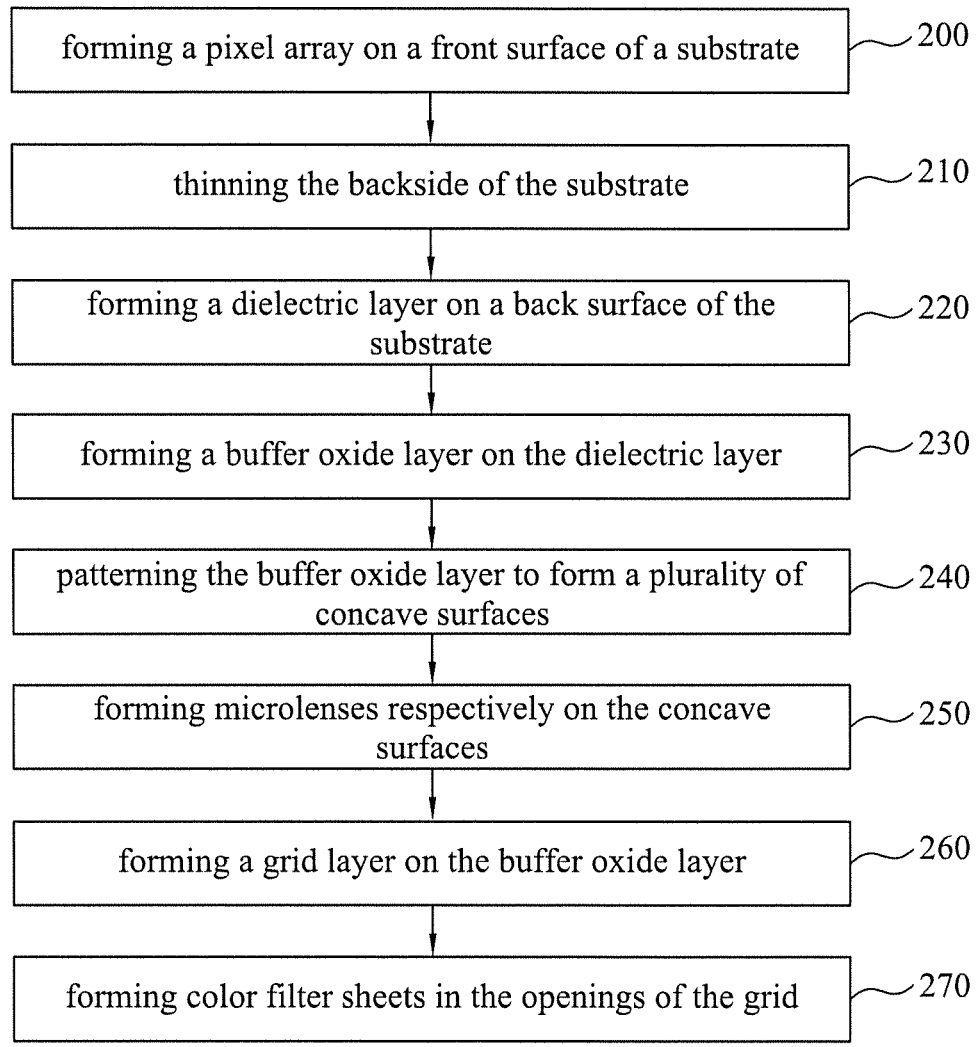
FIG. 2A is a flow chart illustrating a process of manufacturing a backside illuminated CMOS image sensor device shown in FIG. 1 according to some embodiments of this disclosure.
Figure 2B:
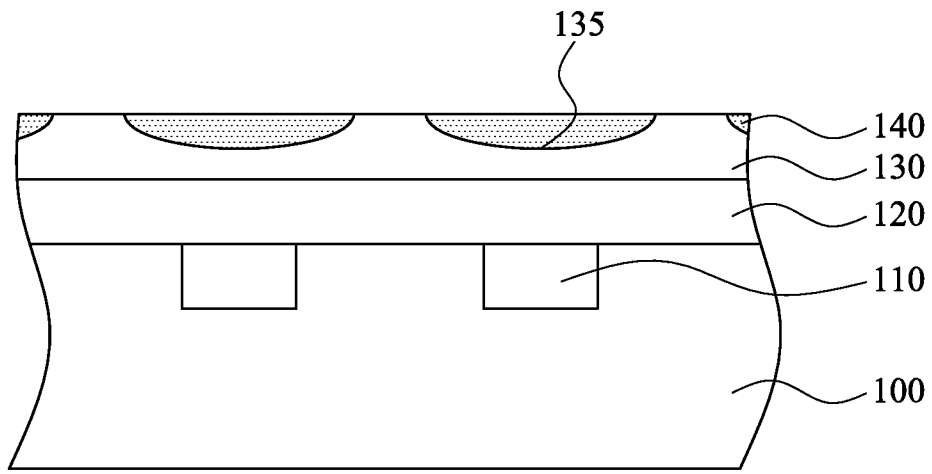
FIGS. 2B-2C are cross-sectional diagrams illustrating the manufacturing process in FIG. 2A, according to some embodiments of this disclosure.
Figure 2C:
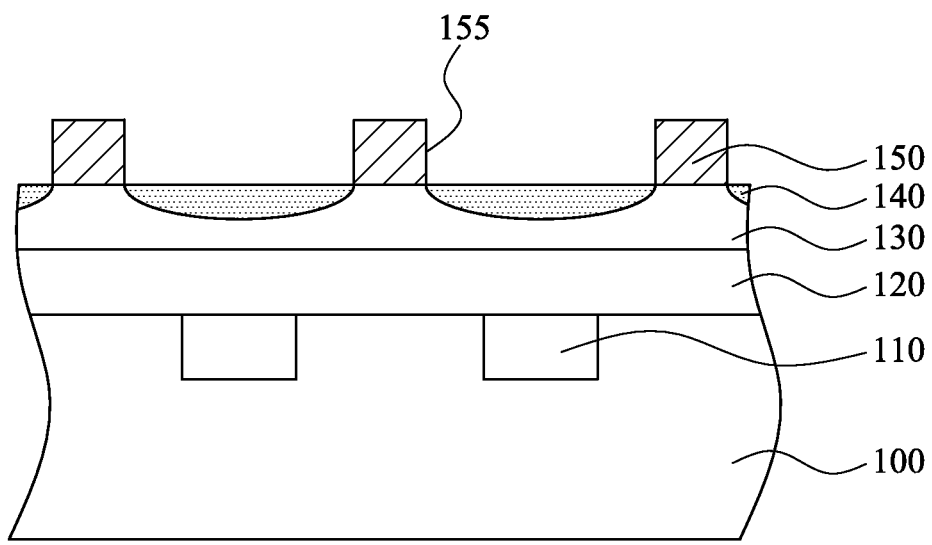

FIG. 2A is a flow chart illustrating a process of manufacturing a backside illuminated CMOS image sensor device shown in FIG. 1 according to some embodiments of this disclosure. FIGS. 2B-2C are cross-sectional diagrams illustrating the manufacturing process in FIG. 2A. Therefore, FIGS. 2A-2C are referred below at the same time.

In FIG. 2B and step 200, a pixel array is formed on a front surface of the substrate 100. The pixel array includes photodiodes 110 in the substrate 100. In step 210, the backside of the substrate 100 is thinned to reduce the thickness of the substrate 100 to allow light strike the photodiodes 110 in the substrate 100. The thinning method can be performed by chemical mechanical polishing or blanket etching process, for example.

Next, in step 220-230, a dielectric layer 120 and a buffer oxide layer 130 are sequentially formed on the back surface of the substrate 100. The forming method of the dielectric layer 120 can be performed by chemical vapor deposition or spin coating, for example. The forming method of the buffer oxide layer 130 can be chemical vapor deposition, for example.

In step 240, the buffer oxide layer 130 is patterned to form a plurality of concave surfaces 135 positioned to respectively align with each photodiode 110 in the pixel array. The patterning method can be performed by photolithography and etching, for example. In step 250, micro-lenses 140 are formed on the concave surfaces 135, respectively.

In FIG. 2C and step 260, a grid layer 150 is formed on the buffer oxide layer 130. The grid layer 150 has a plurality of openings 155 to respectively expose the micro-lenses 140. The formation method of the grid layer 150 can be performed by a deposition, photolithography, and/or etching process, for example.

Finally in step 270, color filter sheets 160 are formed in the openings 155 to obtain the CMOS image sensor shown in FIG. 1. The formation method of the color filter sheets 160 can be done by a spin coating process, for example.

Figure 3A:
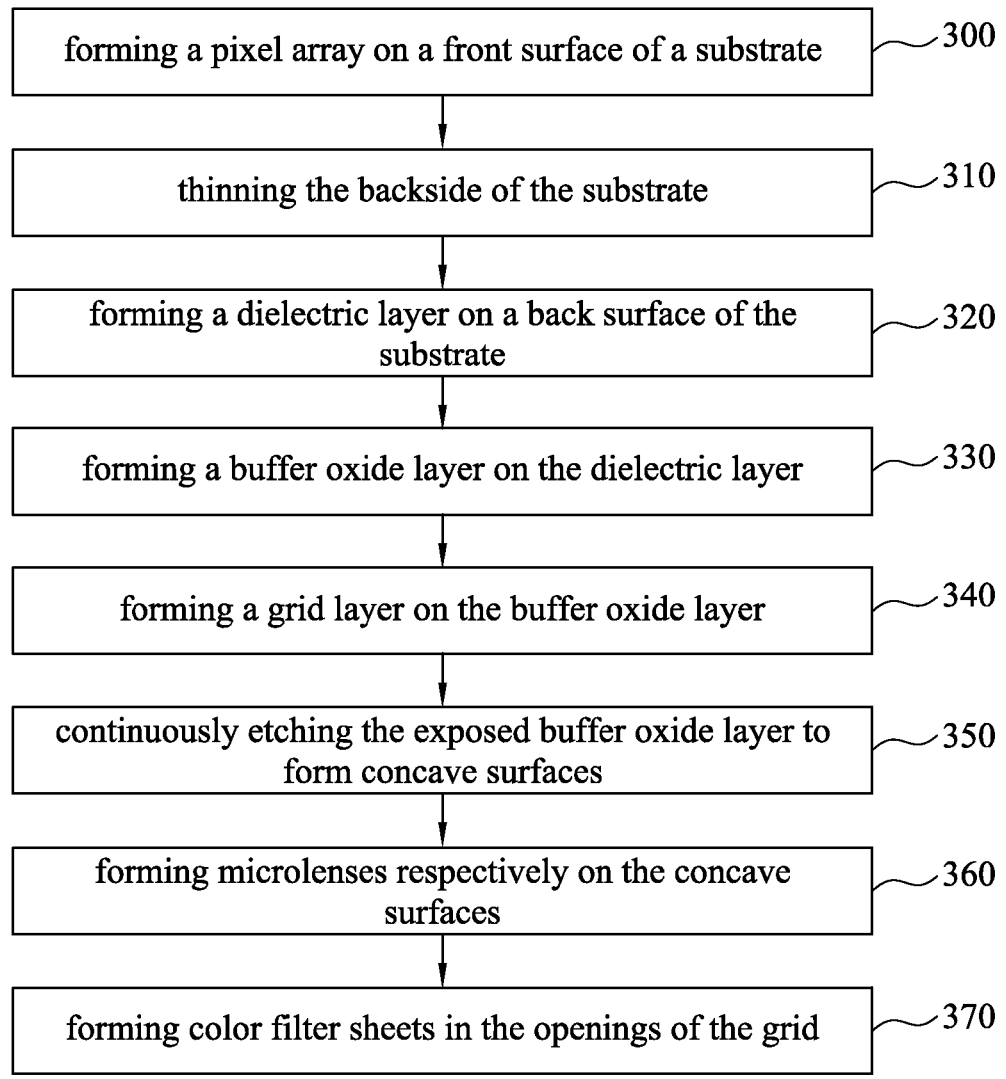
FIG. 3A is a flow chart illustrating a process of manufacturing a backside illuminated CMOS image sensor device shown in FIG. 1 according to some other embodiments of this disclosure.
Figure 3B:
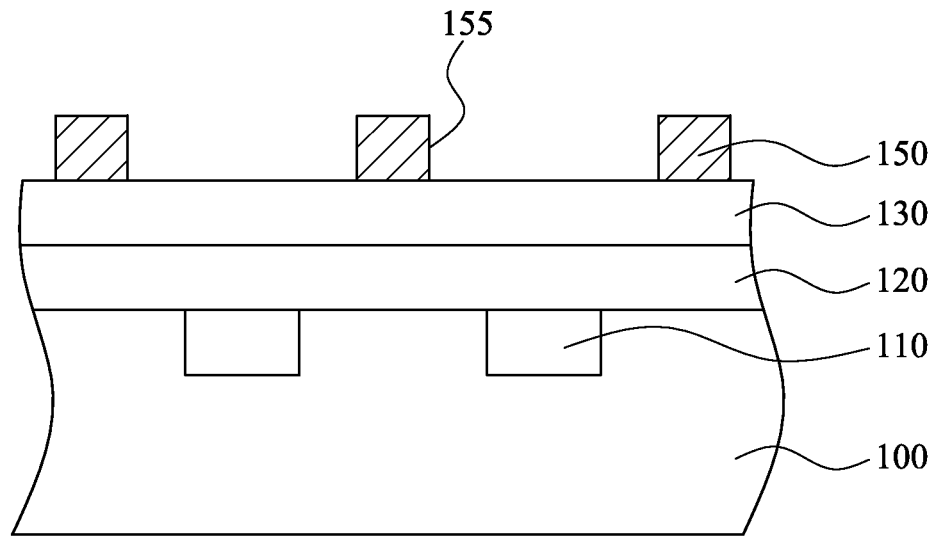
FIGS. 3B-3C are cross-sectional diagrams illustrating the manufacturing process in FIG. 3A, according to some embodiments of this disclosure.
Figure 3C:
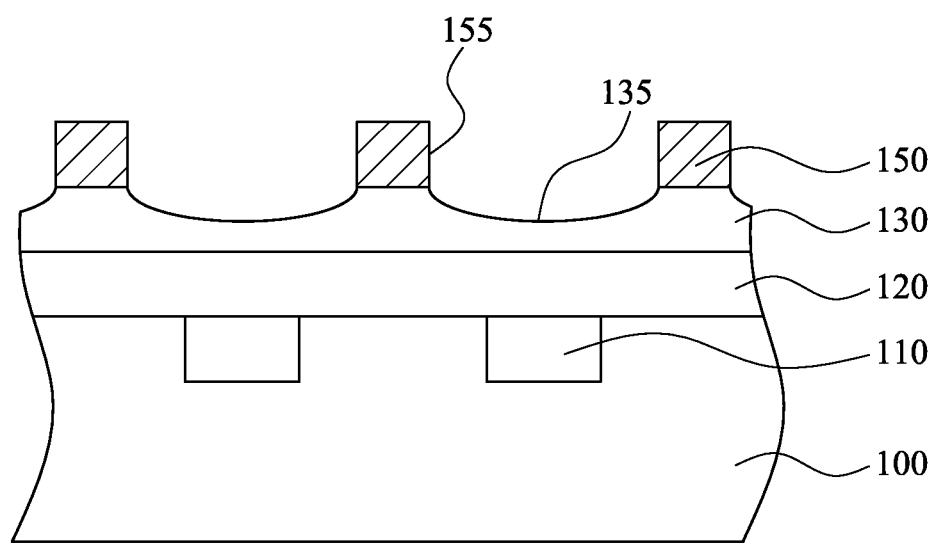

FIG. 3A is a flow chart illustrating a process of manufacturing a backside illuminated CMOS image sensor device shown in FIG. 1 according to some other embodiments of this disclosure. FIGS. 3B-3C are cross-sectional diagrams illustrating the manufacturing process in FIG. 3A. Therefore, FIGS. 3A-3C are referred below at the same time.

In FIG. 3B and step 300, a pixel array is formed on a front surface of the substrate 100. The pixel array includes photodiodes 110 in the substrate 100. In step 310, the backside of the substrate 100 is thinned to reduce the thickness of the substrate 100 to allow light strike the photodiodes 110 in the substrate 100. The thinning method can be performed by a chemical mechanical polishing or a blanket etching process, for example.

Next, in step 320-330, a dielectric layer 120 and a buffer oxide layer 130 are sequentially formed on the back surface of the substrate 100. The forming method of the dielectric layer 120 can be chemical vapor deposition or spin coating, for example. The forming method of the buffer oxide layer 130 can be performed by chemical vapor deposition, for example.

In step 340, a grid layer 150 is formed on the buffer oxide layer 130. The grid layer 150 has a plurality of openings 155, which is disposed to respectively align with each photodiodes 110 in the pixel array. The formation method of the grid layer 150 can be performed by deposition, photolithography, and/or etching, for example.

In FIG. 3C and step 350, the buffer oxide layer 130 exposed by the openings 155 is etched to form concave surfaces 135 at the bottoms of the openings 155. Next in step 360, micro-lenses 140 are formed to be respectively disposed on each of the concave surfaces 135.

Finally in step 370, color filter sheets 160 are formed to be respectively disposed in each of the openings 155 to obtain the CMOS image sensor shown in FIG. 1. The formation method of the color filter sheets 160 can be performed by a spin coating process, for example.

Accordingly, in some embodiments, a backside illuminated CMOS image sensor device is provided. The backside illuminated CMOS image sensor comprises a substrate, a dielectric layer, a buffer oxide layer, a grid layer, a plurality of embedded micro-lenses, and a plurality of color filter sheets. The substrate has a pixel array on a front surface of the substrate. The dielectric layer is disposed on a back surface of the substrate to cover a backside of the pixel array. The buffer oxide layer is disposed on the dielectric layer, wherein the buffer oxide layer has a plurality of concave surfaces positioned to respectively align with each photodiode in the pixel array. The grid layer is disposed on the dielectric layer and has a plurality of openings to respectively expose the concave surfaces of the buffer oxide layer. The plurality of embedded micro-lenses are respectively disposed on the concave surfaces of the buffer oxide layer. The plurality of color filter sheets are respectively disposed on each of the embedded micro-lenses.

In some other embodiments, a method of manufacturing a backside illuminated CMOS image sensor device is provided. The method comprises the following steps. A dielectric layer is formed on a back surface of a substrate, wherein the substrate has a pixel array formed on a front surface of the substrate. A buffer oxide layer is formed on the dielectric layer. The buffer oxide layer is etched to form a plurality of concave surfaces positioned to respectively align with each photodiode in the pixel array. A plurality of micro-lenses are formed to be respectively disposed on the concave surfaces of the buffer oxide layer. A grid layer with a plurality of openings is formed on the buffer oxide layer, and the plurality of openings respectively expose each of the micro-lenses. A plurality of color filter sheets are formed to be respectively in the openings.

In some other embodiments, another method of manufacturing a backside illuminated CMOS image sensor device is provided. The method comprises the following steps. A dielectric layer is formed on a back surface of a substrate, wherein the substrate has a pixel array formed on a front surface of the substrate. A buffer oxide layer is formed on the dielectric layer. A grid layer with a plurality of openings is formed on the buffer oxide layer, and the openings are positioned to respectively align with each photodiode in the pixel array. The exposed buffer oxide layer is continuously etched to form concave surfaces respectively at the bottoms of the openings. A plurality of micro-lenses are formed respectively on the concave surfaces of the buffer oxide layer. A plurality of color filter sheets are formed respectively in the openings of the grid layer.

Accordingly, in one or more embodiments, embedded micro-lenses with a convex-like or hemispherical cross section are formed on the concave surfaces of the buffer oxide layer and below the color filter sheets. Therefore, the embedded micro-lenses are capable of confining incident light to irradiate on the photodiodes to increase quantum efficiency and decrease optical crosstalk of a CMOS image sensor.

All the features disclosed in this disclosure (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A backside illuminated CMOS image sensor device, comprising:
    a substrate having a pixel array on a front surface of the substrate;
    a dielectric layer disposed on a back surface of the substrate to cover a backside of the pixel array;
    a buffer oxide layer disposed on the dielectric layer, wherein the buffer oxide layer has a plurality of concave surfaces positioned to respectively align with each photodiode in the pixel array;
    a grid layer disposed on the dielectric layer and having a plurality of openings to respectively expose the concave surfaces of the buffer oxide layer;
    a plurality of embedded micro-lenses respectively disposed on the concave surfaces of the buffer oxide layer; and
    a plurality of color filter sheets respectively disposed on each of the embedded micro-lenses, wherein a refractive index of the micro-lenses is smaller than a refractive index of the buffer oxide layer.

2. The backside illuminated CMOS image sensor of claim 1, wherein the dielectric layer is made from a dielectric material having a dielectric constant greater than or equal to silicon oxide.

3. The backside illuminated CMOS image sensor of claim 1, wherein the dielectric layer is made from silicon oxide or silicon nitride.

4. The backside illuminated CMOS image sensor of claim 1,
    wherein the refractive index of the buffer oxide layer is smaller than a refractive index of the dielectric layer.

5. The backside illuminated CMOS image sensor of claim 1,
    wherein a refractive index of the dielectric layer is smaller than a refractive index of the substrate.

6. The backside illuminated CMOS image sensor of claim 1, wherein a focus length of the micro-lenses is equal to a distance from the micro-lenses to the photodiodes.

7. The backside illuminated CMOS image sensor of claim 1, wherein a refractive index of the color filter sheets is smaller than the refractive index of the micro-lenses.

8. The backside illuminated CMOS image sensor of claim 1, wherein the grid layer is made from silicon oxide or metal.

9. The backside illuminated CMOS image sensor of claim 8, wherein the metal is Al, Cu, Cr, or an alloy of Cu.

10. A method of manufacturing a backside illuminated CMOS image sensor device, the method comprising:
    forming a dielectric layer on a back surface of a substrate, wherein the substrate has a pixel array formed on a front surface of the substrate;
    forming a buffer oxide layer on the dielectric layer;
    etching the buffer oxide layer to form a plurality of concave surfaces positioned to respectively align with each photodiode in the pixel array;
    forming a plurality of micro-lenses respectively disposed on the concave surfaces of the buffer oxide layer;
    forming a grid layer on the buffer oxide layer and with a plurality of openings exposing each of the micro-lenses; and
    forming a plurality of color filter sheets respectively in the openings, wherein a refractive index of the micro-lenses is smaller than a refractive index of the buffer oxide layer, for avoiding total reflection of incident light.

11. The method of claim 10, wherein the dielectric layer is made from a dielectric material having a dielectric constant greater than or equal to silicon oxide.

12. The method of claim 10, wherein the grid layer is made from silicon oxide or metal.

13. The method of claim 10, wherein a focus length of the micro-lenses is substantially equal to the distance from the micro-lenses to the photodiodes.

14. A method of manufacturing a backside illuminated CMOS image sensor device, the method comprising:
    forming a dielectric layer on a back surface of a substrate, wherein the substrate has a pixel array formed on a front surface of the substrate;
    forming a buffer oxide layer on the dielectric layer;
    forming a grid layer on the buffer oxide layer and with a plurality of openings positioned to respectively align with each photodiode in the pixel array and continuously etching the exposed buffer oxide layer to form concave surfaces respectively at the bottoms of the openings;
    forming a plurality of micro-lenses respectively on the concave surfaces of the buffer oxide layer; and
    forming a plurality of color filter sheets respectively in the openings of the grid layer, wherein a refractive index of the micro-lenses is smaller than a refractive index of the buffer oxide layer, for avoiding total reflection of incident light.

15. The method of claim 14, wherein the dielectric layer is made from a dielectric material having a dielectric constant greater than or equal to silicon oxide.

16. The method of claim 14, wherein the grid layer is made from silicon oxide or metal.

17. The method of claim 14, wherein a focus length of the micro-lenses is substantially equal to the distance from the micro-lenses to the photodiodes.

* * * * *